United States Patent [19]

Yamada et al.

[11] Patent Number: 4,651,098

[45] Date of Patent: Mar. 17, 1987

[54] METHOD FOR IMAGING NUCLEAR MAGNETIC RESONANCE SIGNALS BY USING NON-LINEAR MAGNETIC FIELD GRADIENT

[75] Inventors: Yoshifumi Yamada, Utsunomiya; Kunio Tanaka, Asahikawa; Zenwemon Abe, Yokohama, all of Japan

[73] Assignee: Utsunomiya University, Utsunomiya, Japan

[21] Appl. No.: 656,932

[22] Filed: Oct. 2, 1984

[30] Foreign Application Priority Data

Oct. 11, 1983 [JP] Japan .................................. 58-189484

[51] Int. Cl.[4] .......................................... G01R 33/20
[52] U.S. Cl. ...................................... 324/309; 324/313
[58] Field of Search ............... 324/300, 307, 309, 312, 324/313, 311, 318, 319, 320

[56] References Cited

U.S. PATENT DOCUMENTS

| 4,319,190 | 3/1982 | Brown | 324/313 |
| 4,442,404 | 4/1984 | Bergmann | 324/309 |
| 4,558,277 | 12/1985 | Post et al. | 324/309 |
| 4,573,015 | 2/1986 | Abe et al. | 324/313 |

Primary Examiner—Michael J. Tokar
Attorney, Agent, or Firm—Stevens, Davis, Miller & Mosher

[57] ABSTRACT

The phase of nuclear magnetization in a target placed in a homogeneous magnetic field and excited by a high-frequency magnetic field is encoded by applying a specifying magnetic field with a non-linear gradient thereto, and the specifying magnetic field is scanned across the target, and the encoded NMR signals are received and processed so as to produce an image of the distribution of nuclear magnetic substance in the target.

4 Claims, 6 Drawing Figures

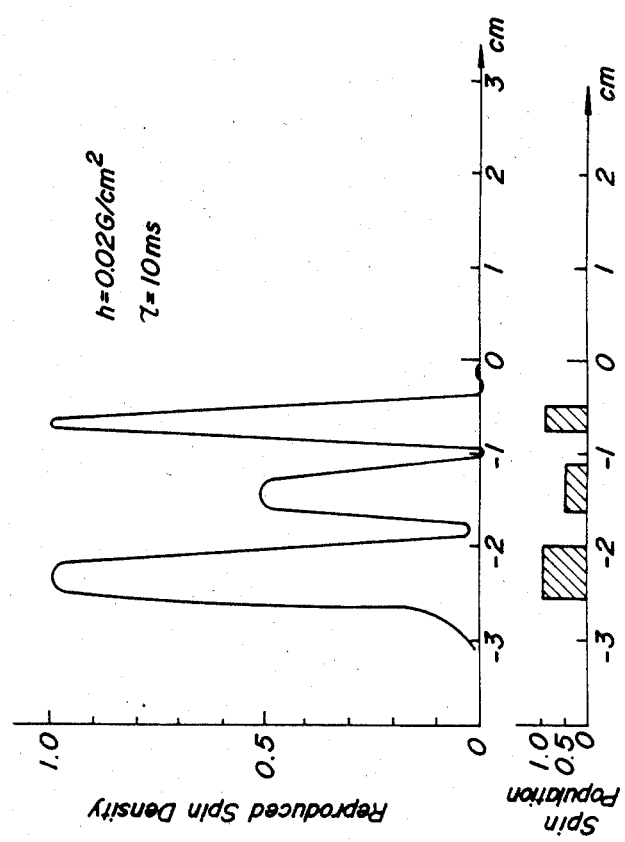

METHOD FOR IMAGING NUCLEAR MAGNETIC RESONANCE SIGNALS BY USING NON-LINEAR MAGNETIC FIELD GRADIENT

BACKGROUND OF THE INVENTION

1. Field of the Invention

This invention relates to a method for imaging nuclear magnetic resonance (to be referred to as "NMR", hereinafter) signals by using a non-linear magnetic field gradient which signals carry information on distribution of nuclear magnetic substance, such as hydrogen (H), fluorine (F), sodium (Na), carbon (C), phosphorus (P), and the like elements, in a body being measured (to be referred to as a "target", hereinafter). More particularly, the invention relates to a method of imaging NMR signals, in which the phase of nuclear magnetization at each local spot in the target is encoded by using a specifying magnetic field with a non-linear gradient, such as a gradient along a quadratic curve, of the magnetic field intensity, and NMR signals with different degrees of contribution from nuclear magnetizations at different localities are obtained by scanning the specifying magnetic field, so as to facilitate computer processing of the NMR signals for imaging, whereby an NMR image of an entire target can be formed efficiently in a short period of time without necessitating generation of any strong non-linear magnetic field gradient.

2. Description of the Prior Art

As a conventional method for imaging NMR signals carrying information on the inside of a target, an NMR computed tomography (to be referred to as the "NMR-CT", hereinafter), using a linear magnetic field gradient is known. More specifically, a conventional method for NMR imaging is based on the fact that when the NMR signals are detected under the presence of a linear magnetic field gradient, the spectrum of the NMR signals becomes proportionate to a projected image of the spin distribution in the target, the projected image being taken in a direction perpendicular to the direction of the magnetic field gradient. The conventional method forms an image of NMR-CT by applying the same algorithm as that of the x-ray computed tomography (to be referred to as the "x-ray CT", hereinafter) to a plurality of such projected images detected by varying the direction of the linear magnetic field gradient to a number of orientations.

Another conventional method for NMR imaging is based on the fact that when free precession of nuclear magnetization is effected under the presence of a linear magnetic field gradient, the phase of the nuclear magnetization varies in proportion to the spatial position in the target, and that quantities proportional to one-dimensional Fourier transformation (FT) of the spin density distribution can be obtained by systematically varying the timing and the value of the magnetic field gradient for effecting the free precession of the nuclear magnetization. Thus, in the so-called FT zeugmatography or spin warp method of the prior art, which has been clinically tested, data proportional to two-dimensional or three-dimensional Fourier transformation of the spin density distribution are produced by switching the direction of the magnetic field gradient in orthogonal two directions or orthogonal three directions, and imaging is effected by taking the inverse Fourier transform of the data.

Various NMR-CT approaches of the prior art, which use the linear magnetic field gradient, have a shortcoming in that a strong magnetic field gradient is necessary to achieve a high spatial resolution in the obtained image, and the strong magnetic field gradient tends to cause expansion of the NMR spectrum and reduction in the height of the NMR spectrum, so that the S/N ratio of the obtained image is reduced with the increase in the strength of the linear magnetic field gradient for a given intensity of the static magnetic field. Accordingly, in order to improve the resolution of the obtained image without deteriorating the S/N ratio thereof, it becomes necessary to increase the static magnetic field intensity. Then, the conventional NMR-CT using the linear magnetic field gradient has a major technical problem or shortcoming in that a strong static magnetic field with a high homogeneity over a wide range and a high stability must be provided.

Recently, it has been proposed to specify a small restricted region of the target for measurement by using a non-linear magnetic field gradient or the so-called specifying magnetic field. For instance, the inventors proposed methods for collection of information only from the proximity of the center of the specifying magnetic field with non-linear gradient based on the difference in the NMR frequency, as disclosed in the inventors' Japanese Patent Laid-open Publications No. 103,693/1974, No. 127,785/1976, and No. 133,192/1979 relating to methods for imaging NMR signals.

The conventional method for imaging NMR signals using a non-linear magnetic field gradient has a shortcoming in that a specifying magnetic field to be used therein is required to have a strong non-linear gradient to specify a small region for measurement and to clearly define the boundary of such small region, and coils with comparatively large ampere-turns are necessary for the generation and scanning manipulation of the specifying magnetic field with such strong non-linear gradient. The requirement for coils with large ampere-turns is a kind of limitation to the formation of a large imaging device, especially a large magnetic field generator.

Besides, the above-mentioned conventional method for imaging NMR signals by using the non-linear magnetic field gradient has another shortcoming in its slowness in producing two- or three-dimensional images. More particularly, the specifying magnetic field with the non-linear gradient specifies a small region for each direct measurement, so that each application of the high-frequency (to be referred to as "HF", hereinafter) pulse magnetic field for detection of nuclear magnetization yields measured data from only a small region, and it takes a long time to collect sufficient data for imaging the entire target on a two- or three-dimensional basis. As compared with the NMR-CT methods using the linear magnetic field, the methods using the non-linear magnetic field may be left behind as far as the speed of collecting the measured data is concerned.

SUMMARY OF THE INVENTION

Therefore, an object of the present invention is to obviate the above-mentioned shortcomings of the prior art by providing an improved method for imaging NMR signals by using a non-linear magnetic field gradient without necessitating any excessive increase of the intensity of the specifying magnetic field with a non-linear gradient. Thus, the method for imaging NMR signals by using a non-linear magnetic field gradient according to the invention eliminates the need of an excessive increase of ampere-turns for exciting the nuclear magnetization, produces measured data from an entire measuring region for each application of the HF pulse magnetic field for detection of the nuclear magnetization, and ensures efficient imaging in a short period of time with an excellent S/N ratio.

Another object of the invention is to provide a method for imaging NMR signals by using a non-linear magnetic field gradient, in which method NMR signals carrying information covering an entire imaging region can be obtained at one time by using a specifying magnetic field with a non-linear gradient including a change of magnetic field intensity along a quadratic curve, and a large number of NMR signals carrying measured data are obtained from each scanning point in response to scanning of the specifying magnetic field by either varying the current in a scanner coil or mechanically moving a generator coil thereof, and the NMR signals thus obtained are processed by a computer so as to produce an image of information of spin density distribution in the imaging region.

A further object of the invention, is to provide a method for imaging NMR signals by using a non-linear magnetic field gradient, in which method sufficient phase change of the nuclear spin necessary for identifying individual points in an imaging region cn be obtained by scanning over a wide region with a comparatively weak specifying magnetic field with a non-linear gradient, so as to facilitate the use of a weak static magnetic field and to eliminate the need of a strong linear magnetic field gradient in the conventional NMR-CT for improving the resolution without reducing the S/N ratio.

To fulfill the above objects of the invention, in a preferred embodiment of the method for imaging NMR signals from a target by using a non-linear magnetic field gradient, a homogeneous static magnetic field is applied to the target, and a pulse-like HF magnetic field is also applied to the target from a transmitter coil at right angles to said static magnetic field so as to excite nuclear magnetization in the target. The HF magnetic field has a Larmor frequency corresponding to the intensity of the homogeneous static magnetic field. Immediately thereafter, a specifying magnetic field with a non-linear gradient of magnetic field intensity is applied to the target for a certain period of time so as to spatially encode the phase of the nuclear magnetization in a certain locality of the target in a non-linear fashion by causing free precession of the nuclear magnetization. The specifying magnetic field has a magnetic field intensity varying in a non-linear manner.

The specifying magnetic field is spatially scanned by shifting the center of the non-linear gradient thereof over a center scan distance by a specifying field scanner. The above encoding is successively repeated while effecting the spatial scanning of the specifying magnetic field at each encoding, and the encoded NMR signals from the target are detected by a receiver coil. A plurality of the encoded NMR signals thus detected have different degrees of contribution from the nuclear magnetizations at different localities of the target. Such encoded NMR signals are processed by a computer so as to produce an image of the information carried thereby, i.e., the information relating to the distribution of nuclear magnetic substance in the target.

BRIEF DESCRIPTION OF THE DRAWING

For a better understanding of the invention, reference is made to the accompanying drawings, in which.

Figures 3A, 3B:
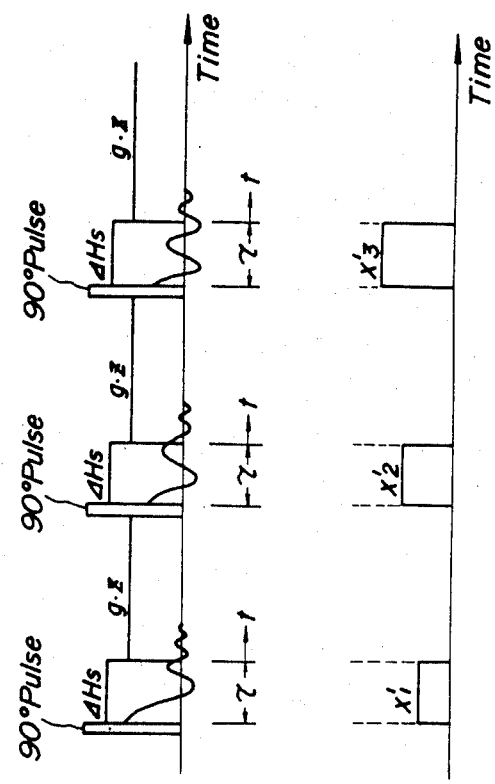

The curves (a) and (b) of FIG. 3 show the manner in which pulse-like magnetic fields are applied to a target in a method according to the present invention; and The curves (a) and (b) of FIG. 4 show the result of a numerical simulation of the reproduction of nuclear spin density distribution by a method for imaging NMR signals according to the present invention.

Throughout different views of the drawing, U1 through U4 are constituent units of a device suitable for carrying out the method according to the present invention; A is a target; B is an electromagnet for producing a homogeneous static magnetic field; C1 is a scanner coil for scanning a specifying magnetic field; C2 is a generator coil of the specifying magnetic field; D is a transmitter coil of HF magnetic field; T is a transmitter; R is a receiver; 1 is a radio frequency (RF) oscillator; 2 is a program pulse generator; 3 is a wave-shaping gate; 4 is an RF power amplifier; 5 is a preamplifier; 6 is a main amplifier; 7 is a phase-sensitive detector; 8 is an A/D (analog-to-digital) converter; 9 and 10 are D/A (digital-to-analog) converters; 11 and 12 are D.C. power amplifiers; 13 is a highly stabilized D.C. power source; 14 is a control computer; and 15 is a peripheral display device.

DESCRIPTION OF THE PREFERRED EMBODIMENT

The invention will be described in detail by referring to preferred embodiments illustrated in the drawings. Overall arrangement of a device suitable for imaging the information on the inside of a target by a method for imaging NMR signals according to the invention is shown in FIG. 1, and the disposition of major constituent elements of the device is shown in FIG. 2.

Figure 1:
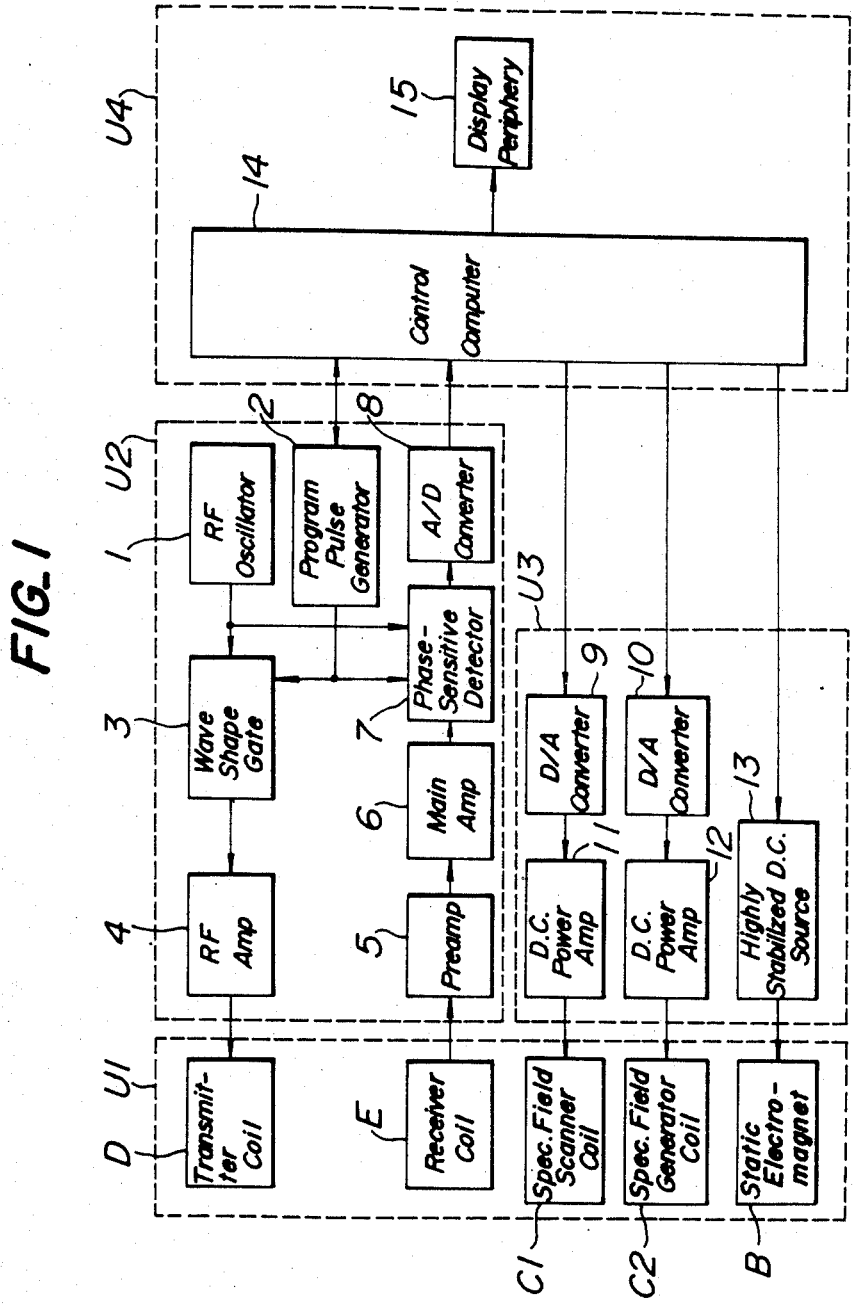
FIG. 1 is a block diagram which schematically shows fundamental formation of a device for imaging NMR signals carrying internal information of a target by using a method according to the present invention.

Referring to FIG. 1, a first unit U1 is an NMR apparatus having a transmitter coil D, a receiver coil E, a set of electromagnets B for producing a homogeneous static magnetic field $H_o$, a specifying magnetic field generator coil C2, and a scanner coil C1 of the specifying magnetic field. The coils and the electromagnets in the first unit U1 are connected as shown in FIG. 2. A second unit U2 and a third unit U3 form means to drive various constituent elements of the first unit U1, while a fourth unit U4 is a control means of the entire device for NMR imaging.

Figure 2:
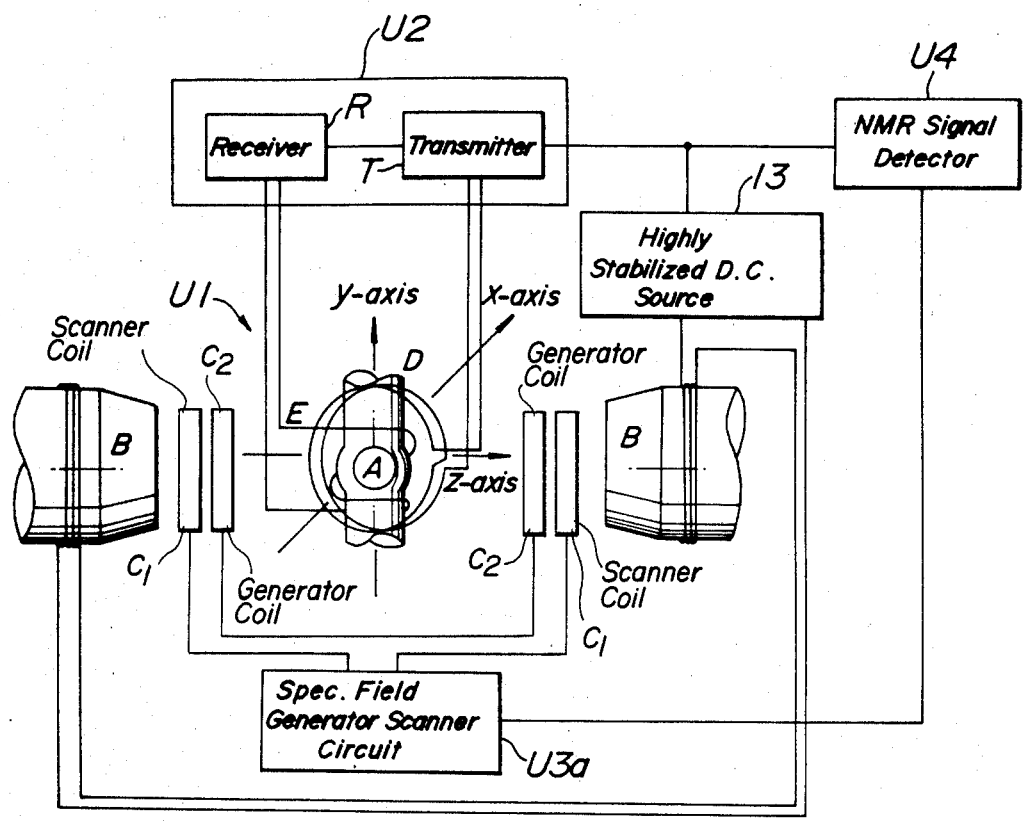
FIG. 2 is a schematic diagram showing formation and arrangement of various elements for generating a variety of magnetic fields for producing the NMR signals.

In the arrangement of FIG. 2, a pair of electromagnets B facing each other with a spacing therebetween are energized by a highly stabilized D.C. power source 13, so as to produce a homogeneous static magnetic field $H_o$. The specifying magnetic field generator coil C2 and the scanner coil C1 of the specifying magnetic field are disposed in the proximity of the electromagnets B and energized by a specific magnetic field scanning circuit U3a, so as to superpose a specifying magnetic field $\Delta H_s$ of suitable configuration onto the static magnetic field $H_o$.

Instead of the illustrated pair of mutually facing electromagnets B of FIG. 2, various other means may be used for producing the homogeneous static magnetic field $H_o$, such as air-core coils, superconductive magnets or permanent magnets. In FIG. 2, the coils C1 and C2 for generating and scanning the specifying magnetic field $\Delta H_s$ are disposed along the z-axis, but it is also possible to dispose them along the x-axis or y-axis depending on the manner in which the specifying magnetic field is generated and scanned in the specific application.

A target A is placed in the composite magnetic field ($H_o + \Delta H_s$) thus formed by the superposition of the homogeneous static magnetic field and the specifying magnetic field. The transmitter coil D is disposed around the target A and energized by the transmitter T of the second unit U2, so as to superpose a high-frequency magnetic field onto the composite magnetic field. When the frequency of the high-frequency magnetic field thus superposed coincides with the nuclear magnetic resonance frequency of the specific nucleus being measured within the target A, resonant energy absorption from the thus applied high-frequency magnetic field occurs, and the NMR alternating magnetic field in response to such energy absorption is picked up by the receiver coil E. The electromotive force induced in the receiver coil E is applied to the receiver R of the second unit U2 and detected there as NMR signals.

The axes of the transmitter coil D and the receiver coil E are disposed perpendicular to the direction of the homogeneous static magnetic field $H_o$ produced by the static magnetic field generator electromagnets B. The nuclear magnetic substance in the target A has a Larmor frequency which is determined by the intensity of the static magnetic field at the target A with a one-to-one relationship. When the high-frequency magnetic field with the Larmor frequency is applied to the target A by the transmitter coil D, the NMR phenomenon takes place, and an electromotive force of that frequency is induced in the receiver coil E. If the high-frequency magnetic field of the Larmor frequency is applied in the form of a pulse having a suitable duration and a suitable magnitude, a detectable signal with diminishing amplitude is produced by nuclear spin excited in the target A even after removing such pulse-like high-frequency magnetic field, which diminising signal has a Larmor frequency depending on the static magnetic field surrounding the target A when the high-frequency magnetic field is removed therefrom.

The nuclear spins in the target A after the removal of the high-frequency magnetic field do free precession at a Larmor frequency which is determined by the surrounding static magnetic field with one-to-one relationship. Accordingly, if a specifying magnetic field $\Delta H_s$ with a non-linear variation of magnetic field intensity is applied to the target A by the specifying magnetic field generator coil C2 for a certain period of time immediately after the removal of the high-frequency magnetic field, the phase of the nuclear spins at a region of the target A is shifted depending on the intensity of the specifying magnetic field $\Delta H_s$ at that region. Thus, information which varies depending on the position in the target A can be converted into phase information, and signals in the form of an integral of contributions from such phase information can be obtained.

Accordingly, if such signals in the form of an integral are successively detected while scanning or shifting the specifying magnetic field $\Delta H_s$ by the specifying field scanner coil C1, the contribution of the nuclear spin phase information to the detected signal varies from region to region in the target A because the intensity of the specifying magnetic field $\Delta H_s$ varies in a non-linear fashion. Therefore, spin density informations at different regions in the target A can be obtained for each region separately by collecting necessary number of detected signals as data and processing such detected signals by a computer.

The specifying magnetic field for producing the characterizing nuclear spin phase information from spatial information concerning the inside of a target can assume any of various configurations; namely, a bar-shaped specifying magnetic field having cylindrical contour surfaces of the magnetic field intensity, a star-like specifying magnetic field having saddle-shaped contour surfaces of the magnetic field intensity, or a spherical or ellipsoidal specifying magnetic field having spherical or ellipsoidal contour surfaces of the magnetic field intensity. In any of the above specifying magnetic fields, the change of magnetic field intensity at a point is proportional to the square of the distanace from the central position to that point.

The generator coil C2 of the specifying magnetic field in the first unit U1 of the illustrated embodiment can be made of parallel wires, a rectangular coil, or a circular coil, provided that the desired specifying magnetic field is generated thereby. The specifying magnetic field is electrically scanned by the scanner coil C1 of the first unit U1, without affecting the configuration of the specific magnetic field to any significant extent. In practice, such scanning of the specifying magnetic field may be easily effected by shifting the generator coil C2 or moving the target A itself, instead of the scanning by the above scanner coil C1.

The generator coil C2 of the specifying magnetic field may be provided with accessories, such as a compensator coil means for providing compensation for systematic magnetic field intensity offset which may accompany the generation of the specifying magnetic field, a linear gradient generator coil means for generating a linear magnetic field in a different spatial direction, or a non-linear gradient generator coil means for generating a planar homogeneous magnetic field region.

As pointed out above, the first unit U1 comprising the homogeneous static magnetic field generator magnets B, the transmitter coil D and the receiver coil E is an essential NMR apparatus having those elements which are selectively driven by the combined action of the second unit U2 and the third unit U3 under the control of the forth unit U4. The fourth unit U4 not only effects the overall control of the device of FIG. 1, but also processes the measured data and provides display of the outcome thereof.

The formation and function of each unit of the device for imaging the NMR signals will be described now.

An RF oscillator 1 of the first unit U1 generates a high-frequency signal having a Larmor frequency corresponding to the magnetic field intensity of the homogeneous static magnetic field $H_o$ in the target A. A wave-shaping gate circuit 3 gates the high-frequency signal from the RF oscillator 1 in response to the output pulse from a program pulse generator 2 which is ruled by the control computer 14, so that a high-frequency pulse with a certain frequency spectrum is delivered to the transmitter coil D through an RF power amplifier 4. Thus, a high-frequency magnetic field with the certain frequency spectrum is applied to the target A by the transmitter coil D, so that nuclear magnetization is excited either universally throughout the entire regions of the target A to be imaged or selectively on that selected or planar region of the target A, which selected or planar region is formed by superposing a specifying magnetic field onto the target A by the generator coil C2 of the first unit U1, the specifying magnetic field having a linear magnetic field gradient or planar non-linear magnetic field gradient with a planar region of homogeneous magnetic field intensity.

The nuclear magnetization thus excited in the target A has a magnetization component in a direction perpendicular to the homogeneous static magnetic field $H_o$, and such magnetization component is maximized when the high-frequency magnetic field pulse for the excitation satisfies the conditions of the so-called 90° pulse. Immediately after the end of the high-frequency magnetic field pulse for excitation, the specifying magnetic field is applied to the target A by the generator coil C2 of the first unit U1. Whereby, the nuclear magnetization component perpendicular to the homogeneous static magnetic field $H_o$ is caused to do free precession at that Larmor frequency which corresponds to the magnetic field intensity of the specifying magnetic field $\Delta H_s$ at the position of such nuclear magnetization component. In response to such free precession, NMR signals are generated at various points in the target A, and the NMR signals are synthesized at the receiver coil E for producing a comparatively weak composite high-frequency current in the receiver coil E.

The high-frequency current is amplified by a preamplifier 5 and a main amplifier 6 of the second unit U2. The amplifier current is applied to a phase-sensitive detector 7 for detection by using the oscillating frequency of the RF oscillator 1 as a reference signal, and the so-called free induction decay (to be referred to as the "FID", hereinafter) signal is obtained.

In an embodiment of the invention, the specifying mangetic field $\Delta H_s$ is applied to the target A for a time period $\tau$. In response to it, the nuclear magnetizations at different regions of the target A do free precessions at different Larmor frequencies depending on the magnetic field intensity of the specifying magnetic field $\Delta H$, so that the amplitude of the FID signal at the end of the time period $\tau$ is proportional to the composite or synthesized sum of the non-linear phase movement of individual nuclear magnetization at each region relative to the spatial coordinates, which non-linear phase movement can be in the form of a quadratic function. At time $\tau$, the application of the specifying magnetic field $\Delta H_s$ is ceased, and immediately thereafter a static magnetic field having a linear magnetic field gradient in a certain direction is either applied to the target A or not applied. The FID signals due to the homogeneous static magnetic field $H_o$ or spin echo signals due to the above-mentioned applications of magnetic field in pulse-form are converted into digital signals by the A/D converter 8, and the thus converted digital signals are delivered to the control computer 14 for processing.

The above operation is repeated while shifting the specifying magnetic field $\Delta H_s$ by a certain amount at a time by the scanner coil C1 of the specifying magnetic field, and the FID signals or the spin echo signals are successively converted into digital signals and applied to the control computer 14 as measured data signals. The control computer 14 carries out frequency analysis and imaging operation on such measured data signals, and the image thus obtained is shown on the peripheral display 15.

Besides, the control computer 14 provides signals for generating and scanning the specifying magnetic field, which signals are applied to the generator coil C2 and the scanner coil C1 after being processed by the A/D converters 9, 10 and the D.C. power amplifiers 11, 12. Thereby, the computer 14 controls the generation and scanning of the specifying magnetic field $\Delta H_s$ and the generation and stipulation of the linear magnetic field gradient or the planar non-linear magnetic field gradient. The highly stabilized D.C. power source 13 actuates the static electromagnets B under the control of the control computer 14 so as to produce the homogeneous static magnetic field $H_o$.

Practical embodiments of the present invention will be described now, in which embodiments a method of the invention is applied to the NMR imaging device of the above structure so as to image information on the inside of a target.

A first embodiment to be described is an NMR imaging method which uses bar-shaped specifying magnetic field which has contour lines of magnetic field intensity extending in parallel to the direction of a homogeneous static magnetic field $H_o$, the contour lines of the magnetic field intensity passing a closed circle on a plane such as x-y plane perpendicular to the homogeneous static magnetic field $H_o$, as disclosed by the inventors in their Japanese Patent Laid-open Publication No. 133,192/1979 and their Japanese Patent Application No. 154,491/1982. If the coordinates of the center of such bar-shaped specifying magnetic field are given by (x', y'), the intensity deviation of the specifying magnetic field at a measuring point (x, y) in a target A is given by $$\Delta H_s(x,y,z;x',y') = h_0 + h\{(x'-x)^2 + (y'-y)^2\} \quad (1)$$

here, h is a constant depending on the number of turns of, the dimensions of, and the current in the generator coil C2 for the specifying magnetic field, and $h_o$ is a homogeneous magnetic field offset superposed on the homogeneous static magnetic field $H_o$.

In this embodiment, an operation of applying pulse-like magnetic field is effected: Namely, as the bar-shaped specifying magnetic field is scanned in the x-axis and y-axis directions, each time the central position (x', y') of the bar-shaped specifying magnetic field is passed the above-mentioned 90° pulse magnetic field is applied by the transmitter coil D. Immediately after the 90° pulse magnetic field, the bar-shaped specifying magnetic field given by the equation (1) is applied for a time period of $\tau$, as shown in FIG. 3. Thereafter, a static magnetic field having a linear gradient in the z-axis direction is applied by using a coil means therefor which is built in the generator coil C2 for the specifying magnetic field.

The curve (a) of FIG. 3 schematically shows the time relation between the specifying magnetic field and the linear magnetic field pulse, and also FID signals generated in response to the application of the magnetic fields. The curve (b) of FIG. 3 shows the timing relating to scanning current pulses to be applied to the scanner coil C1 of the specifying magnetic field. The center of the bar-shaped specifying magnetic field is shifted in the x-axis direction by varying the amplitude of the current pulse of the curve (b).

In the present embodiment, two phase-sensitive detectors 7 are provided, and one of them uses the high-frequency output signals from the RF oscillator 1 as reference signals thereof without any modification, while the other one of them shifts the phase of the high-frequency output signals from the RF oscillator 1 by 90° so as to use the thus phase-shifted HF signals as the reference signals therof. When the amplified output signals from the main amplifier 6 are applied to the two detectors 7 in parallel, the two detectors 7 produce a pair of FID signals which have a phase difference of 90°. The pair of FID signals can be collectively dealt with as a complex FID signal, by dealing one of the two FID signals as a real part and the other one of the two FID signals as an imaginary part. Referring to the curve (a) of FIG. 3, the complex FID signals after the period of time $\tau$ is given by $$V(x',y',t) = \iiint_{-\infty}^{\infty} \rho(x,y,z) \cdot e^{-(\tau+t)/T_2} \cdot \\ e^{-j\{\gamma h_0 \tau + \gamma h \tau \{(x'-x)^2 + (y'-y)^2\} + \gamma(h_0' + gz)t\}} dx \cdot dy \cdot dz \quad (2)$$

here, $\rho(x,y,z)$ is a spin density distribution function, which can be treated as the nuclear magnetization distribution function under the thermal equilibrium conditions, g is a magnitude of the linear magnetic field gradient in the z direction, and $h_0'$ is a magnetic field offset superposed on the linear magnetic field gradient in the z-axis direction.

The Fourier transformation of the equation (2) with respect to the time t, the time t being taken after the switching of the non-linear specifying magnetic field to the static magnetic field with the linear magnetic field gradient, renders the following equation, provided that the intensity of the linear magnetic field gradient is sufficiently strong.

$$V(x',y',\omega) = \quad (3)$$

$$\pi/\gamma g \cdot e^{-\tau/T_2} \cdot e^{-j\gamma h_0 \tau} \iint_{-\infty}^{\infty} \rho\{x,y, -(\omega/\gamma g + h_0'/g)\} \cdot \\ e^{-j\gamma h \tau \{(x'-x)^2 + (y'-y)^2\}} dx \cdot dy$$

here, $$Z = -(\omega/\gamma g + h_0'/g) \quad (4)$$

In the equations (2) and (3), $T_2$ is a spin-spin relaxation time and $\gamma$ is the magnetogyric ratio.

As can be seen from the equation (3), the spin distribution in the z-axis direction can be separated from the Fourier transformation of those FID signals which respond to the application of the static magnetic field with the linear magnetic field gradient in the z-axis direction. Accordingly, since the spin distribution in the z-axis direction can be separated by applying the equation (3) to the FID signals obtained in response to the linear magnetic field gradient, three-dimensional spin distribution can be reproduced by reproducing the x-axis direction and y-axis direction spin distributions for each angular frequency $\omega$. The integral term of the equation (3) is in the form of an integral of the product of the spin density distribution $\rho(x,y,z)$ with the phase term $e^{-j\gamma h \tau \{(x'-x)^2 + (y'-y)^2\}}$ over the entire region of the variables x, y, and such form of integral represents an integral of the nuclear magnetization at a point (x, y) after rendering a phase shift proportional to the square of the distance from the central position (x', y') of the bar-shaped specifying magnetic field to that point.

Accordingly, as the center of the specifying magnetic field moves, the phase shift varies in a non-linear manner or in line with a quadratic function. Physically, it means that the application of the bar-shaped specifying magnetic field $\Delta H_s$ for a time period of $\tau$ results in the encoding of phase of the nuclear magnetization at the point (x, y) in a manner proportional to the square of the distance from the central position (x', y') of the bar-shaped specifying magnetic field to that point. The Fourier transformation $V(x', y', \omega)$ of the FID signals after the conversion to the linear magnetic field gradient g·z as a function of the central position (x', y') of the bar-shaped specifying magnetic field $\Delta H_s$ is in the form of a convolution integral with respect to x' and y', and such convolution integral can be solved comparatively easily. A practical method of solving it is as follows: namely, expansion of the exponential term in the integral and the calculation by using Fourier transformation render the following result.

$$\rho\left(\frac{\omega_x}{2\gamma h \tau}, \frac{\omega_y}{2\gamma h \tau}, -\left(\frac{\omega}{\gamma \cdot g} + \frac{h_0'}{g}\right)\right) = \quad (5)$$

$$\left(\frac{\gamma g}{\pi}\right)\left(\frac{\gamma h \tau}{\pi}\right)^2 \cdot e^{\{(\tau/T_2) + j\gamma h_0 \tau\}} \cdot e^{j(\omega_x^2 + \omega_y^2)/4\gamma h \tau} \cdot \\ \iint_{-\infty}^{\infty} \{V(x',y',\omega) \cdot e^{j\gamma h \tau(x'^2 + y'^2)}\} \cdot e^{-j(\omega_x \cdot x' + \omega_y \cdot y')} dx' \cdot dy'$$

here, $$\omega_x = 2\gamma h \tau \cdot x,$$

$$\omega_y = 2\gamma h \tau \cdot y \quad (6)$$

Thus, the reproduction of the spin density distribution function, i.e., the actual procedure for the imaging, becomes as follows.

(1) As the bar-shaped specifying magnetic field is scanned electrically or mechanically, the FID signals for each of the central points (x', y') in response to the pulse series shown in the curve (a) of FIG. 3 are measured after the moment of switching to the linear magnetic field gradient.

(2) The Fourier transformation $V(x', y', \omega)$ of those FID signals is determined by integration of the equation (3) with respect to t.

(3) An exponential term $e^{j\gamma h \tau(x'^2 + y'^2)}$ is multiplied to the thus determined Fourier transformation $V(x', y', \omega)$, so as to effect the two-dimensional Fourier transformation with respect to x' and y'.

(4) An exponential term $e^{j(\gamma h_0 \tau + (\omega_x^2 + \omega_y^2)/4\gamma h \tau)}$ is multiplied to the result of the two-dimensional Fourier transformation. Even if the amplitude correction term $(\gamma g/\pi)(\gamma h \tau/\pi)^2 e^{\tau/T_2}$ of the equation (5) is not multiplied, the form is not affected.

In the above embodiment, the details of the means for producing the specifying magnetic field, such as the bar-shaped specifying magnetic field, are the same as those disclosed by the inventors in the above-mentioned Japanese Patent Publications.

The method for imaging NMR signal according to the invention has been described by referring to three-dimensional imaging of the spin density distribution with the use of the bar-shaped specifying magnetic field, but there are cases where two-dimensional imaging such as two-dimensional tomography is sufficient. Another embodiment of the invention for two-dimensional imaging will be described now.

To effect the pulse-like magnetic field application for the two-dimensional imaging, a generator coil C2 has a built-in coil means for producing a linear magnetic field gradient in the y-axis direction. Under the presence of the thus produced linear magnetic field gradient in the y-axis direction, a selective 90° pulse which is waveshaped so as to have a narrow frequency spectrum is applied to the target A. As a result, nuclear magnetization is excited in the target A only on a slice-like region thereof parallel to the x-z plane, and the thus excited nuclear magnetization has the same Larmor frequency as the frequency spectrum of the selective 90° pulse. Then, the means for the linear magnetic field gradient is switched to the generator coil C2 proper so as to produce the above-mentioned bar-shaped specifying magnetic field extending in the z-axis direction. As shown in the curve (a) of FIG. 3, after applying the specifying magnetic field for a time period $\tau$, a linear magnetic field gradient in the z-axis direction is applied to the target A by another coil means built in the generator coil C2 for the specifying magnetic field.

Complex FID signals are produced in response to the pulse-like magnetic field application to the target A while shifting the bar-shaped specifying magnetic field in the x-axis direction. If the y-axis direction thickness of the slice-like region of the target A in parallel to the x-z plane is selected to be sufficiently thin, the y-component in the integral of the equation (2) becomes a constant. Accordingly, a two-dimensional tomogram for each selected slice-like region of the target A can be produced by effecting calculation of the equation (5) for two directions, i.e., x-axis and z-axis directions. In this case, the scanning of the bar-shaped specifying magnetic field only in the x-axis direction is sufficient, and scanning in the y-axis direction is of course unnecessary.

Instead of the slice-like region in parallel to the x-z plane, slice-like regions in parallel to the y-z plane can be selected for the two-dimensional tomography by replacing the x-axis direction with the y-axis direction in the above description of the two-dimensional tomography in parallel to the x-z plane, including the coil means for producing the linear magnetic field gradient which coil means are built in the generator coil C2 for the specifying magnetic field.

As to the observation of signals after the phase encoding by the application of the specifying magnetic field, the above embodiments use the complex FID signals under the constant magnetic field gradient as shown in FIG. 3. It is also possible to use those complex spin echo signals which carry the same information such as the frequency spectrum and the phase. To this end, referring to the curve (a) of FIG. 3, after a certain time period $t_w$ from the moment of switching the bar-shaped specifying magnetic field to the linear magnetic field gradient in the z-axis direction, either the direction of the magnetic field gradient is reversed or the strong non-selective 180° pulse is applied, and the complex spin echo signals can be observed after another time period $t_w$ from the magnetic field gradient reversal or the application of the 180° pulse.

As in the case of the complex FID signal, the complex spin echo signal has two components, one treated as a real portion and the other one treated as an imaginary portion, which are outputs from two phase-sensitive detectors 7 using two reference frequencies with a phase difference of 90° therebetween.

The specifying magnetic field has a profile of magnetic field intensity which varies in accordance with a quadratic function. The bar-shaped specifying magnetic field is one example. Besides, the spherical or ellipsoidal specifying magnetic field having spherical or ellipsoidal closed contours of magnetic field intensity, or the star-like specifying magnetic field having saddle-like open contours of magnetic field intensity can be also used in the method of the invention. The central position of any of the above-mentioned specifying magnetic field can be scanned by an electric means. The star-like specifying magnetic field can be easily produced by using annular coil pairs or the like. The spherical or ellipsoidal specifying magnetic field can be produced by using a combination of the coils for producing the bar-like specifying magnetic field and the coils for the above-mentioned bar-shaped specifying magnetic field.

As another embodiment of the invention, a method for three-dimensional imaging of spin density distribution by scanning a spherical, ellipsoidal, or star-like specifying magnetic field will be described now. In such specifying magnetic field produced by any of the above-mentioned coils, the deviation of the magnetic field intensity in the proximity of its central position is given by the following equation.

$$\Delta H_s(x,y,z;x', y', z') = h_0 + h_1\{(x'-x)^2 + (y'-y)^2\} + h_2(z'-z)^2 \quad (7)$$

here, x, y, z are spatial coordinates in the target A, x', y', z' are the coordinates of the central point of the specifying magnetic field, $h_o$ is offset superposed on the homogeneous static magnetic field, $h_1$ and $h_2$ are constants depending on the shape, number of turns, and dimensions of and the current in the coils for producing the specifying magnetic field.

It is noted that in the case of the spherical specifying magnetic field, $h_1 = h_2 (>0)$; in the case of the ellipsoidal specifying magnetic field, $h_1 > 0$, $h_2 > 0$ ($h_1 \neq h_2$); and in the case of the star-like specifying magnetic field, $h_1 > 0$ and $h_2 < 0$, or $h_1 < 0$ and $h_2 > 0$.

If the nuclear magnetization of the entire region is turned by 90 degrees by using a highly non-selective 90° pulse, and if the above specifying magnetic field of the equation (7) is applied immediately thereafter so as to encode the phase of the nuclear magnetization in a non-linear manner, the amplitude of the complex FID signals at time $\tau$ is given by $$V(x',y',z',\tau) = e^{-(1/T_2 + j\gamma h_0)\tau} \cdot \iiint_{-\infty}^{\infty} \rho(x,y,z) \cdot e^{-j\gamma\tau[h_1\{(x'-x)^2 + (y'-y)^2\} + h_2(z'-z)^2]} \cdot dx \cdot dy \cdot dz \quad (8)$$

It is noted that the integrals with respect to x, y, z in the equation (8) are all convolutions. Accordingly, imaging of the three-dimensional spin density distribution can be effected by the three-dimensional scanning of central positions (x', y', z') of the above-mentioned specifying magnetic field followed by the calculation of the convolution of the sampled data of the complex FID signals for each position at time $\tau$ through Fourier transformation.

Instead of using the sampled values of the complex FID signals at time $\tau$ under the presence of the specifying magnetic field, it is also possible to use the complex FID signals under the presence of the homogeneous static magnetic field $H_o$. More particularly, in the latter case, after the application of the 90° pulse the specifying magnetic field is applied for a time period $\tau$, in a manner similar to the pulse sequence shown in the curve (a) of FIG. 3, and then the free precession takes place under the presence of the homogeneous static magnetic field $H_o$, so that complex FID signals under the presence of the homogeneous static magnetic field $H_o$ after the time $\tau$ are detected as functions of time and Fourier transformation are taken from the complex FID signals, for selection and use of the frequency components rendering the maximum values. The value of the Fourier transformation is proportional to the integral of the equation (8). In the pulse sequence of this case, the linear magnetic field gradient of FIG. 3 is replaced with the homogeneous static magnetic field and the scanning is effected for the coordinates x', y', and z'. The processing of the signal in this case is by using an algorithm which is substantially the same as that for the processing of the data by the equations (3) through (6) in the x-axis, y-axis and z-axis directions.

As described in detail in the foregoing, a method for imaging NMR signals carrying information on the inside of a target images the information covering the entire inside regions of the target very efficiently in a short time period by using a non-linear magnetic field gradient of comparatively weak intensity.

FIG. 4 shows the result of a numerical simulation of imaging NMR signals according to the method of the invention for a simple case of one-dimensional imaging. The numerical simulation relates to the numerical calculation of one-dimensional spin density distribution in the x-axis direction. The curve (a) of FIG. 4 shows reproduced spin density distribution, which is obtained by applying the above-mentioned calculations and operations of FID signals generated for a spin distribution as shown in the curve (b) of the figure. The parameters were $h_o=0$, $h=0.02$ Gauss/cm$^2$, and $\tau=10$ ms.

In the foregoing, a method for imaging NMR signals according to the invention has been described by referring to a case of using the bar-shaped specifying magnetic field. If selective excitation of the nuclear magnetization is effected at first under the presence of the linear magnetic field gradient in the z-axis direction so as to excite the nuclear magnetization on a planar slice-like region parallel to the x–y plane, one can obtain an image showing two-dimensional spin density distribution on a plane parallel to the x–y plane. In this case, $\omega$ in the equations (3) and (4) assumes one value. The method for imaging NMR signals for slice-like regions is not restricted to the use of the bar-shaped specifying magnetic field, but the method similarly applies to cases where the spherical or ellipsoidal specifying magnetic field or the star-like specifying magnetic field produced by circular coil pairs is used.

Although the invention has been described with a certain degree of particularity, it is understood that the present disclosure has been made only by way of example and that numerous changes in details of construction and the combination and arrangement of parts may be resorted to without departing from the scope of the invention as hereinafter claimed.

What is claimed is:

1. A method for imaging nuclear magnetic resonance (NMR) signals from of a target by using non-linear magnetic field gradient, comprising steps of
    applying a homogeneous static magnetic field to said target;
    applying a high-frequency (HF) magnetic field in a pulse-like manner from a transmitter coil to said target at right angles to said static magnetic field so as to excite nuclear magnetization in said target, said HF magnetic field having a Larmor frequency corresponding to intensity of said homogeneous static magnetic field;
    immediately thereafter applying a specifying magnetic field with a non-linear gradient of magnetic field intensity to said target for a certain period of time so as to spatially encode the phase of the nuclear magnetization in a certain locality of the target in a non-linear fashion by causing free precession of said nuclear magnetization, said specifying magnetic field having a magnetic field intensity varying in a non-linear manner;
    spatially scanning said specifying magnetic field by shifting a center of said non-linear gradient thereof over a certain scan distance by a specifying field scanner;
    successively repeating said encoding while effecting said spatial scanning of the specifying magnetic field at each encoding;
    detecting encoded NMR signals from said target by a receiver coil; and
    computer-processing a plurality of the encoded NMR signals having different degrees of contribution from the nuclear magnetizations in different localities of the target, so as to image information carried by the encoded NMR signals relating to distribution of nuclear magnetic substance in said target.

2. A method for imaging NMR signals as set forth in claim 1, further comprising a step of applying a static magnetic field with a linear gradient of magnetic field intensity to said target immediately after end of the application of said specifying magnetic field with the non-linear gradient.

3. A method for imaging NMR signals as set forth in claim 2, wherein the HF magnetic field to be applied in a pulse-like manner is of 90° HF pulse form, which HF magnetic field non-selectively excites the nuclear magnetization in an entire region to be imaged in the target at a time; the specifying magnetic field with the non-linear gradient to be applied for the certain period of time immediately thereafter has a quadratic curve deviation of magnetic field intensity on a certain plane; the static magnetic field with the linear gradient is applied to the target after the specifying magnetic field at right angles to said certain plane, so as to measure nuclear magnetic resonance free induction decay (NMR-FID) signals generated after the application of said static magnetic field with the linear gradient; said measurement of the NMR-FID signals is repeated while effecting two-dimensional scanning of said specifying magnetic field with the non-linear gradient on said certain plane while time-sequentially switching the magnetic field for each scanning point; and the computer-processing is numerically effected on the thus measured NMR-FID signals by finding frequency components thereof through frequency analysis so as to treat the frequency components as functions of coordinates of the scanning points of said two-dimensional scanning, whereby three-dimensional distribution of the nuclear magnetic substance in said target is imaged.

4. A method for imaging NMR signals as set forth in claim 2, wherein the HF magnetic field to be applied in a pulse-like manner is in the form of wave-shaped 90° HF pulse having a narrow frequency spectrum distribution, and a static magnetic field having either a linear gradient of magnetic field intensity or a non-linear gradient of magnetic field intensity including a planar contour surfaces of magnetic field intensity is applied to the target in synchronism therewith, so that the nuclear magnetization is selectively excited only in a certain planar region of the target; the specifying magnetic field with the non-linear gradient to be applied for the certain period of time immediately thereafter has a quadratic curve deviation of magnetic field intensity on the certain planar region; the static magnetic field having the linear gradient is applied to the target from a certain direction along said certain planar region, so as to measure nuclear magnetic resonance free induction decay (NMR-FID) signals generated after the application of the static magnetic field with the linear gradient; said measurement of the NMR-FID signals is repeated while effecting one-dimensional scanning of said specifying magnetic field with the non-linear gradient on said certain planar region in a direction of equi-magnetic field intensity line of said magnetic field with the linear gradient, while time-sequentially switching the magnetic field for each scanning point; and the computer-processing is numerically effected on the thus measured NMR-FID signals by finding frequency components thereof through frequency analysis so as to treat the frequency components as functions of coordinates of the scanning points of said one-dimensional scanning, whereby two-dimensional distribution of the nuclear magnetic substance in said target is imaged.

* * * * *